United States Patent
Hata et al.

(10) Patent No.: US 8,669,652 B2
(45) Date of Patent: Mar. 11, 2014

(54) LEAD COMPONENT AND METHOD FOR MANUFACTURING THE SAME, AND SEMICONDUCTOR PACKAGE

(75) Inventors: Shohei Hata, Yokohama (JP); Yuichi Oda, Hitachi (JP); Kazuma Kuroki, Hitachinaka (JP); Hiromitsu Kuroda, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 34 days.

(21) Appl. No.: 13/421,244

(22) Filed: Mar. 15, 2012

(65) Prior Publication Data

US 2012/0248592 A1 Oct. 4, 2012

(30) Foreign Application Priority Data

Mar. 29, 2011 (JP) ................. 2011-073424

(51) Int. Cl.
- *H01L 23/48* (2006.01)
- *H05K 5/02* (2006.01)
- *H01L 21/00* (2006.01)

(52) U.S. Cl.
USPC .... 257/690; 257/771; 257/782; 257/E23.012; 257/E23.041; 257/E23.053; 257/E23.054; 361/813; 438/123

(58) Field of Classification Search
None
See application file for complete search history.

(56) References Cited

U.S. PATENT DOCUMENTS

| 5,001,546 A * | 3/1991 | Butt .................. 257/666 |
| 7,256,501 B2 * | 8/2007 | Okamoto et al. ........... 257/772 |
| 2008/0206590 A1 | 8/2008 | Ikeda et al. |
| 2012/0000965 A1 | 1/2012 | Ikeda et al. |

FOREIGN PATENT DOCUMENTS

| JP | 11172352 A | 6/1999 |
| JP | 11288955 A | 10/1999 |
| JP | 2002261104 A | 9/2002 |
| JP | 2008126272 A | 6/2008 |

* cited by examiner

*Primary Examiner* — Alonzo Chambliss
(74) *Attorney, Agent, or Firm* — Fleit Gibbons Gutman Bongini & Biano PL; Marty Fleit; Paul D. Bianco

(57) ABSTRACT

To provide an inexpensive lead component which can be easily connected to a semiconductor chip and which has satisfactory connectability. There is provided a lead component including a base material having a connection part for connecting to a semiconductor chip, comprising: a solder part having a Zn layer made of a Zn-bonding material rolled and clad-bonded on the base material, and an Al layer made of an Al-bonding material rolled and clad-bonded on the Zn layer, in a prescribed region including the connection part on the base material; and the solder part further comprising a metal thin film composed of one kind or two kinds or more of Au, Ag, Cu, Ni, Pd, and Pt covering a surface of the Al layer.

10 Claims, 10 Drawing Sheets

FIG.14A1
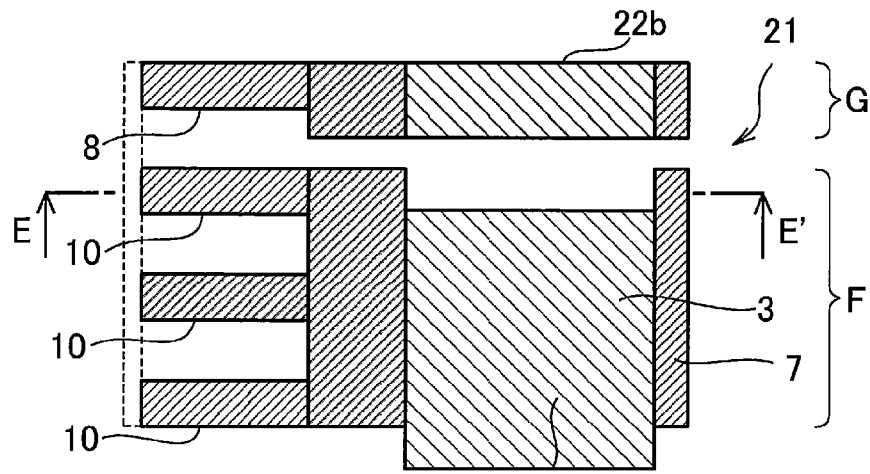
FIG.14A2
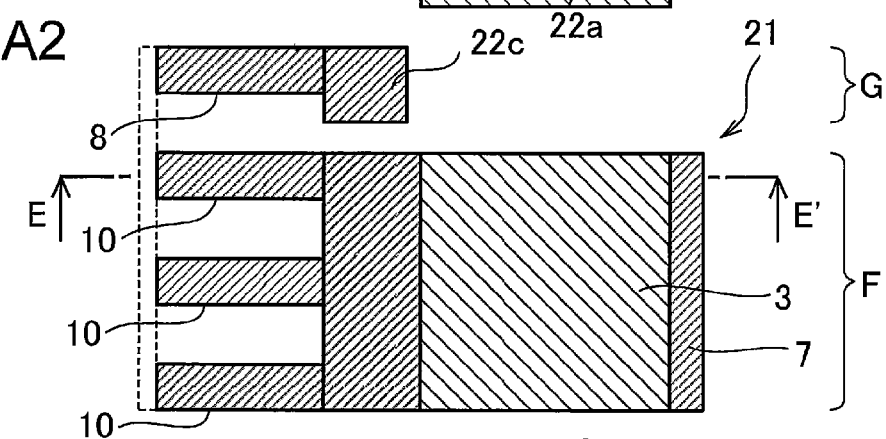
FIG.14B
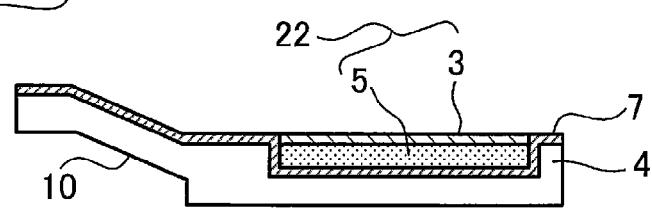
FIG.14C
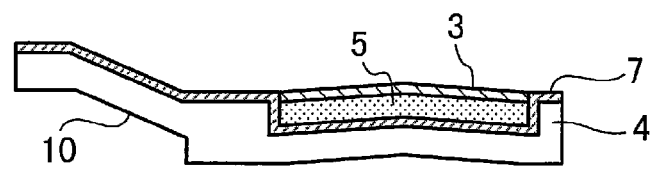
FIG.14D
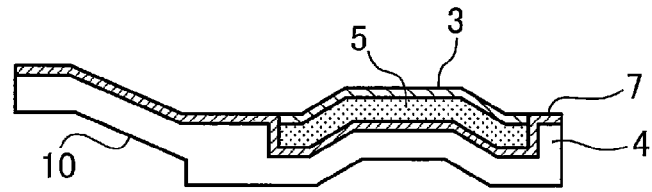
FIG.14E
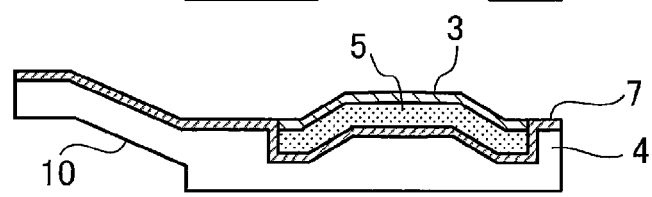

LEAD COMPONENT AND METHOD FOR MANUFACTURING THE SAME, AND SEMICONDUCTOR PACKAGE

The present application is based on Japanese Patent Application No. 2011-73424, filed on Mar. 29, 2011, the entire contents of which are hereby incorporated by reference.

BACKGROUND OF THE INVENTION

1. Technical Field

The present invention relates to a lead component and a method for manufacturing the same, and a semiconductor package, and particularly relates to the lead component suitable for being used inside a semiconductor package.

2. Description of the Related Art

A semiconductor package obtained by die bonding a semiconductor chip onto a lead frame, being a lead component, and electrically connecting a terminal section of the lead frame to an electrode of the semiconductor chip by wire bonding, and thereafter transfer molding is performed thereto using mold resin, is generally known as the semiconductor package. In die bonding, gold-silicon bonding, etc., is used in the past. However, in recent years, high-lead (Pb) solder containing nearly 90% of lead and having a melting point of about 300° C. has been frequently used, because the gold is expensive. Particularly, in a case of a product whose heat dissipation is desired to be increased, the high-lead solder is used for die bonding between the semiconductor chip and the lead frame inside of the semiconductor package. Further, in order to mount a resin-molded semiconductor package on a printed wiring board, etc., lead-tin eutectic solder having a melting point of 183° C. is used. Meanwhile, in a case of a product with little risk of heat generation, an organic film, etc., for die bonding is used in some cases.

However, regulations of environmental impact substances are promoted in each country in view of enhanced environmental consciousness, and use of lead in a solder is partially a regulation object. In order to cope with such a regulation, the lead-tin eutectic solder is replaced with tin-silver-copper solder, etc. Meanwhile, there is no replaceable bonding material in the high-lead solder used for the die bonding between the semiconductor chip and the lead frame inside of the semiconductor package, and therefore the high-lead solder has been excluded from an environmental regulation heretofore. However, lead-free tendency of a solder material is a trend of the times, and development of a lead-free high heat resistant solder material that can be applied to the die bonding of a power semiconductor chip having high heat generation, is desired.

In order to cope with such a situation, for example patent document 1 discloses a technique of a high-temperature solder having a composition of Zn—Al—Mg—Ga. Patent document 1 discloses a technique of realizing a melting point close to that of the high-lead solder, by adding Ga. Further, patent document 1 discloses a technique of using a paste-like solder. However, in the paste-like solder, cleaning after connection is generally required in many cases, and usually there is a possibility that such a paste-like solder can not be applied for general use of mounting the power semiconductor chip in which connectability can be assured without requiring any flux so as not to perform cleaning.

Further, patent document 2 discloses a solder having an optimal composition of Zn—Al.

Patent document 3 discloses a solder structure of cladding on three layers of Zn/Al/Zn, wherein wettability is improved by suppressing a formation of an Al oxide film by cladding Al with Zn, because generally a strong oxide film is formed by Al. In this solder structure, oxidation of Al is suppressed, and therefore wettability of the solder seems to be improved. However, Zn itself is a metal easily oxidized, and therefore suitable connection structure, connecting condition, and connecting apparatus need to be selected.

Further, patent document 4 discloses a technique of forming an Au layer or an Ag layer on a surface of Zn—Al based solder. This technique is the technique of suppressing oxidation of the Zn—Al based solder surface. Generally, the Zn—Al based solder is easily oxidized, and even if applying Au-soldering or Ag-soldering, soldering is applied to already partially oxidized Zn or Al, thus possibly involving an oxide at the time of connection.

As described above, conventional techniques are given as alternatives of the high-lead solder. However, all of them are given on the assumption that the solder material is individually supplied onto the lead frame, and the semiconductor chip is placed thereon to be reflowed.

Patent Document

1. Japanese Patent Laid Open Publication No. 1999-172352
2. Japanese Patent Laid Open Publication No. 1999-288955
3. Japanese Patent Laid Open Publication No. 2008-126272
4. Japanese Patent Laid Open Publication No. 2002-261104

SUMMARY OF THE INVENTION

In the connection with the lead frame of the semiconductor chip, connection is obtained by individually supplying the solder material onto the lead frame, and placing the semiconductor chip thereon, and reflowing soldering. However, it is sometimes time-consuming to set the solder material at a prescribed position. Further, the solder material set at the prescribed position is sometimes deviated from the prescribed position during reflowing. Particularly, in a case of the power semiconductor chip having a collector electrode on a lower surface and an emitter electrode on an upper surface, the solder material and the semiconductor chip with collector electrode directed downward are sequentially placed on the collector-side lead frame. Then, in the step of reflow of soldering by sequentially placing the solder material and the emitter-side lead frame on the emitter electrode on an upper surface of the semiconductor chip, and applying a load thereto, positioning of each member is extremely complicated, thus requiring a high cost.

Further, connection of the solder material itself is a problem. A subject of the Zn—Al based solder is to obtain a connection structure capable of suppressing oxidation of a surface of a solder foil and ensuring connectability, so that the lead component can be applied to the die bonding of the semiconductor chip without requiring any flux.

Patent document 1 discloses a paste-like solder as described above, and there is a possibility that such a solder can't be applied to a general use of the connection performed with no cleaning at all.

In patent document 2, it is estimated that oxidation of a solder surface is hardly suppressed. Further, patent document 3 involves a problem of oxidation of Zn, although oxidation of Al can be suppressed. In these two conventional techniques, it is necessary to take countermeasures in consideration of degradation of wettability due to oxidation of the solder material.

Further, patent document 4 involves a problem of incurring a high cost, although oxidation of the solder material can be suppressed.

As described above, the lead component of the conventional technique has a problem that it is hardly connected with the semiconductor chip, and connectability can't be assured, requiring high cost.

An object of the present invention is to provide an inexpensive lead component that can be easily connected to a semiconductor chip, having satisfactory connectability, and a method for manufacturing the same, and a semiconductor package.

According to a first aspect of the present invention, there is provided a lead component including a base material having a connection part for connecting to a semiconductor chip, comprising:

a solder part having a Zn layer made of a Zn-bonding material rolled and clad-bonded on the base material, and an Al layer made of an Al-bonding material rolled and clad-bonded on the Zn layer, in a prescribed region including the connection part on the base material; and the solder part further comprising a metal thin film composed of one kind or two kinds or more of Au, Ag, Cu, Ni, Pd, and Pt covering a surface of the Al layer.

Further, according to other aspect of the present invention, there is provided a semiconductor package comprising the lead component, and a semiconductor chip connected to a prescribed region including the connection part of the lead component.

Further, according to other aspect of the present invention, there is provided a method for manufacturing a lead component including a base material having a connection part for connecting to a semiconductor chip, comprising:

forming a solder part by sequentially laminating a Zn layer made of a Zn-bonding material on the base material, and an Al layer made of an Al-bonding material on the Zn layer, and a metal thin film composed of one kind or two kinds or more of Au, Ag, Cu, Ni, Pd, and Pt, on the base material, in a prescribed region including the connection part on the base material; and rolling and clad-bonding the solder part together with the base material.

BRIEF DESCRIPTION OF THE DRAWINGS

FIG. 14A1, and FIG. 14A2 are upper side views showing the emitter-side lead component according to a fifth embodiment of the present invention respectively.

FIG. 14B to FIG. 14E are cross-sectional views showing the emitter-side lead component according to the fifth embodiment of the present invention respectively.

Figure 1:
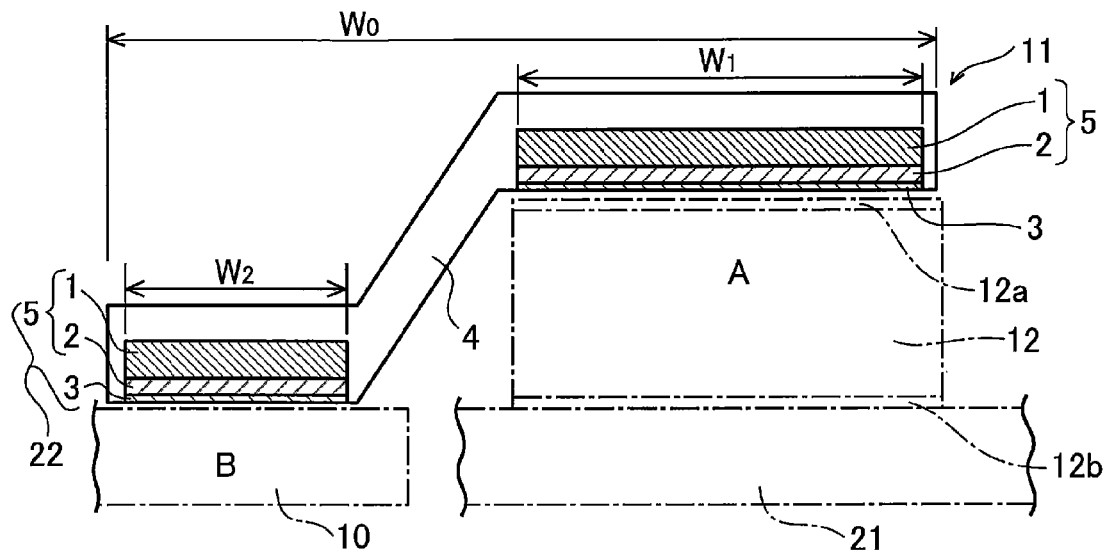
FIG. 1 is a cross-sectional view showing an emitter-side lead component according to a first embodiment of the present invention.

DETAILED DESCRIPTION OF THE INVENTION (Outline of Embodiment)

A lead component of this embodiment includes a base material having a connection part for connecting to a semiconductor chip, comprising:

a solder part having a Zn layer made of a Zn-bonding material rolled and clad-bonded on the base material, and an Al layer made of an Al-bonding material rolled and clad-bonded on the Zn layer, in a prescribed region including the connection part on the base material; and the solder part further comprising a metal thin film composed of one kind or two kinds or more of Au, Ag, Cu, Ni, Pd, and Pt (for example, in a composite manner) covering a surface of the Al layer.

The lead component is a metal raw material of a thin plate used as internal wiring of a semiconductor package, and is a component that functions as a bridge to external wiring. Such a lead component includes not only (1) a lead frame having a semiconductor chip mounted on a printed wiring board by inserting an electrode into the printed wiring board by flow soldering; but also (2) a lead frame having an electrode for surface mounting; (3) a lead-shaped lead frame for electrically connecting an electrode on an upper surface of the semiconductor chip die-bonded on the lead frame, and an electrode of the lead frame.

The semiconductor chip is used not only for a discrete semiconductor such as a power semiconductor, and an optical semiconductor such as a photo-coupler and LED, but also for an integrated circuit such as IC and LSI. The connection part on the base material means a solder portion connected to the semiconductor chip, and a prescribed region including the connection part means a region that can be the connection part, with a solder part formed therein. Regarding the prescribed region including the connection part on the base material of the lead component, an overall prescribed region can be the connection part or only a part of the prescribed region can be the connection part for connecting to the semiconductor chip. The surface of an Al layer may be covered with a metal thin film by plating or by clad-bonding. Note that the Zn layer may be made of a Zn—Al based alloy.

In the lead component, a solder part has a Zn layer clad-bonded on the base material, and an Al layer clad-bonded on the Zn-layer, in a prescribed region including the connection part on the base material. Therefore, by using such a lead component, connectability with the semiconductor chip can be easily assured, compared with a case that the solder material is individually supplied to a prescribed position on the base material.

Further, since the solder materials such as Zn-bonding material and Al-bonding material are rolled in the prescribed region including the connection part on the base material, such solder materials are drawn to thereby newly form an interface, and satisfactory clad-bonding can be assured. Further, since the surface of the Al layer is covered with the metal thin film, oxidation of the Al layer as the solder part, can be suppressed. Further, Zn and Al are turned into liquid by eutectic melting, and the metal thin film is also dissolved into this liquid, and is wet and spread over the semiconductor chip, thus easily connecting the semiconductor chip and the lead component. Accordingly, the connectability with the semiconductor chip can be assured.

Further, the surface of the Al layer is covered with the metal thin film composed of one kind or two kinds or more of Au, Ag, Cu, Ni, Pd, and Pt, and therefore oxidation of the surface of the Al layer can be suppressed. In this case, the Al layer is covered with the metal thin film, unlike a case that oxidation of the surface of the Zn—Al based solder is suppressed by forming an Au soldering layer or an Ag soldering layer. Therefore, a diffusing speed of Zn, Au, and Ag can be made slower than a case that the surface of the Zn—Al based solder is covered with the Au soldering layer or the Ag soldering layer. Therefore, a metal thin film covering state can be maintained for a long period of time. Thus, a risk of involving oxides at a connecting time can be reduced.

Further, the Zn—Al based solder material is used for connecting the semiconductor chip. Therefore, a lead-free state can be realized.

The lead component will be described hereafter, with reference to the drawings. Note that the semiconductor chip will be described, with a power semiconductor chip taken as an example.

FIG. 1 to FIG. 11 show an insertion mounting type lead component for obtaining a flow soldering connection, in which emitter, collector, gate leads are respectively inserted into a hole of the printed wiring board. Further, FIG. 12 shows a state that the semiconductor chip is mounted on the printed wiring board using the lead component shown in FIG. 1 to FIG. 11. The semiconductor package can be manufactured by resin-molding a periphery of the semiconductor chip. The semiconductor package is an insertion mounting type package in which a lead is led out from one of the side surfaces, which is a package capable of positively radiating heat by having a tub (header) attached to a radiator.

Figure 15A:
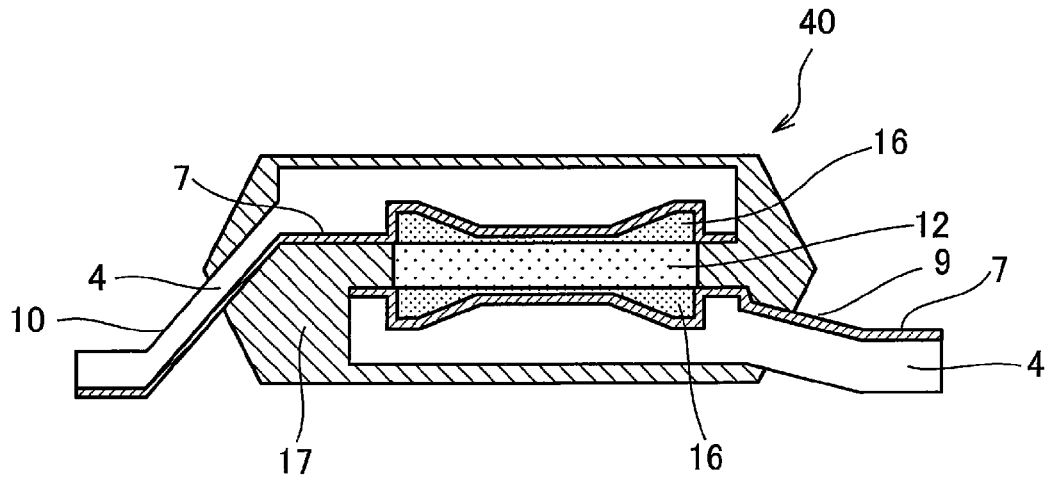
FIG. 15A to FIG. 15C are cross-sectional views showing a semiconductor package according to a sixth embodiment of the present invention, and are cross-sectional views having a semiconductor chip mounted on the collector-side lead component of FIG. 13A to FIG. 13E, and the emitter-side lead component of FIG. 14A1 to FIG. 14E, respectively.
Figure 15B:
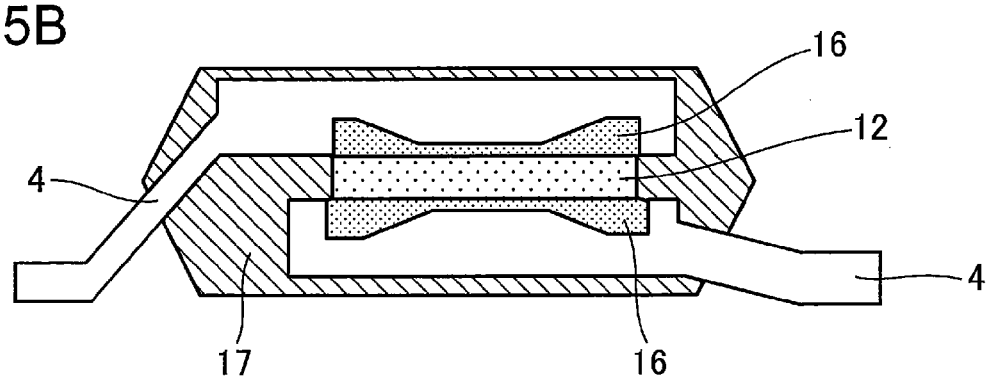
Figure 15C:
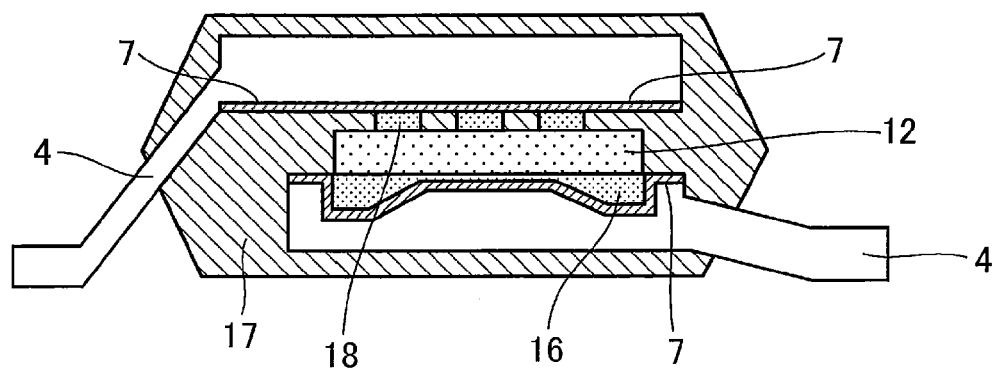

Meanwhile, FIG. 13A to FIG. 13E and FIG. 14A1 to FIG. 14E show a surface mounting type lead component (lead frame) in which the lead is formed for surface-mounting the semiconductor chip on the printed wiring board. Further, FIG. 15A to FIG. 15C, show the semiconductor package packaged by resin-molding the periphery of the semiconductor chip using the lead component shown in FIG. 13A to FIG. 13E, and FIG. 14A1 to FIG. 14E. The semiconductor package shown in FIG. 15A to FIG. 15C is the semiconductor package for surface mounting, in which a Gul wing-shaped (L-shaped) lead is led out from two side surfaces thereof.

A. Insertion Mounting Type Embodiment

First Embodiment (Lead Component)

The lead component includes an emitter-side lead component for connecting an emitter electrode of the semiconductor chip, and a collector-side lead component for connecting a collector electrode of the semiconductor chip. Note that there is also a gate-side lead component for connecting a gate electrode.

(Emitter-Side Lead Component)

FIG. 1 shows an emitter-side lead component 11 for connecting an emitter electrode 12a of a power semiconductor chip 12 according to a fist embodiment. The connection part of an A-side portion (inner portion) at a right side of FIG. 1, is connected to an emitter electrode 12a on an upper surface of the power semiconductor chip 12, with a collector electrode 12b die-bonded onto a header 21 of the collector side lead component. The connection part of a B-side portion (outer portion) is connected to an electrode of an emitter lead 10 of the collector-side lead component. A down set work for more pressing-down the B-side portion (outer portion) than the A-side portion (inner portion), is applied to the lead component 11, to thereby realize above connections.

The emitter-side lead component 11 has a base material (also called a lead frame base material hereafter) 4. The Zn layer made of the Zn-bonding material is laminated, rolled, and clad-bonded on the lead frame base material 4, and the Al layer made of the Al-bonding material is laminated, rolled, and clad-bonded on the Zn layer in a prescribed region including the connection part on the lead frame base material 4. Such a clad-bonding is formed as an inlaid clad bonding with a surface formed into a flat surface in an example shown in the figure, in which a Zn-bonding material forming an Zn-layer 1, and an Al-bonding material forming an Al-layer 2, are buried in an upper surface of the lead frame base material 4 under pressure. Further, in the example shown in the figure, an entire part of the prescribed region is formed as the connection part.

Therefore, owing to this inlaid clad-bonding, the Zn-layer 1 made of the Zn-bonding material as a solder material 5, is laminated on the surface of the lead frame base material 4, and the Al-layer 2 made of the Al-bonding material as the solder material 5 is laminated on the Zn layer. The surface of the Al-layer 2 is further covered with a metal thin film 3. A solder part 22 is constituted of the aforementioned Zn-layer 1, Al-layer 2, and metal thin film 3.

The metal thin film composed of one kind or two kinds or more of Au, Ag, Cu, Ni, Pd, and Pt, can be used as the metal thin film 3. Cu or Ni is preferably selected as the metal thin film 3, in consideration of a cost, and above all, hydrogenreducible Cu is preferable at a relatively low temperature. Explanation will be given hereafter for the metal thin film 3, with Cu taken as an example.

Eutectic dissolution occurs by heating Al and Zn at 382° C. or more. Therefore, connection by the Al-layer 2 and the Zn-layer 1 formed on the surface of the lead frame base material 4, is achieved. In the Zn—Al based alloy, Zn—Al eutectic dissolution occurs at Al concentration of 16.9% or less, at a temperature of 382° C. Therefore, an average composition of the Zn-layer 1 and the Al-layer 2 is set so that the Al concentration is 16.9% or less, and preferably Zn-6 mass % Al in this Al concentration is eutectic. A thickness of each layer is preferably decided so as to achieve this composition. Cu in the metal thin film 3 is dissolved into a liquid in which eutectic dissolution of Zn—Al occurs, thereby forming a part of a solder component.

As the lead frame base material 4, Cu and Cu-alloy, invar alloy with low thermal expansion, 42-alloy, Inconel alloy, kovar alloy, stainless, Ni-based alloy, etc., can be selected depending on the purpose of use. Generally, Cu is frequently used in consideration of thermal conductivity and electric conductivity, and therefore explanation will be given for a case that Cu is selected as the lead frame base material 4.

(Method for Manufacturing the Lead Component)

In order to manufacture a lead component 11 as shown in FIG. 1, first, a raw material of the lead frame base material 4, the solder material 5, and the metal thin film 3 composed of a bar having a prescribed plate thickness and plate width is prepared, in consideration of rolling rates of Cu of the lead frame base material 4, Zn, Al of the solder material 5, and Cu of the metal thin film 3. A Zn raw material, an Al raw material, and a Cu raw material are sequentially laminated in the prescribed region including the connection part on the Cu raw material of the lead frame base material 4, and rolling is carried out. Each metal raw material is drawn by rolling, to thereby newly form an interface, and satisfactory clad-bonding can be obtained. Thereafter, a clad material, being the bar with each raw material clad-bonded thereto, is cut into a prescribed width and prescribed length, which is then subjected to down set work, so as to be formed into a shape as shown in FIG. 1.

In an embodiment of FIG. 1, width $W_1$ of the Zn-layer 1, the Al-layer 2, and the metal thin film 3 positioned at inner A-side, and width $W_2$ of the Zn-layer 1, the Al-layer 2, and the metal thin film 3 positioned at outer B-side, are narrower than width $W_0$ of the lead frame base material 4. Such narrower widths $W_1$, $W_2$ can be achieved by setting the width of each raw material to a prescribed width, and rolling each raw material in a state overlapped on the prescribed region including the connection part. For example, an inlaid clad material with its surface flattened, can be fabricated by rolling and embedding the Zn layer on the base material, the Al layer on the Zn layer, and the Cu layer of the metal thin film 3 on the Al layer having a prescribed width respectively, in the prescribed region of the lead frame base material 4. Thus, the lead component 11 with solder part 22 exposed to the surface of the lead frame base material 4, can be manufactured.

When the power semiconductor chip 12 is connected to the lead component 11, it is also acceptable that the solder material 5 and the metal thin film 3 are clad-bonded to an entire surface including the connection part between the inner A-side and the outer B-side of the lead frame base material 4, with widths of all raw materials aligned with each other, if there is no risk of a short-circuit.

(Reason for Laminating the Solder Material)

As shown in FIG. 1, explanation will be given for a reason for laminating the Zn-layer 1, the Al-layer 2, and the metal thin film 3 on the lead frame base material 4. In a case of bonding the power semiconductor chip 12 at the inner A-side of the lead component 11, bonding is carried out by heating the metal thin film 3 in a state of being pressed against the emitter electrode 12a of the power semiconductor chip 12, thereby melting the solder part 22. An atmosphere at this time is set as a nitrogen atmosphere in which oxygen concentration is reduced, or an atmosphere in which several % of hydrogen is added to the nitrogen atmosphere. Hydrogen is added for improving wettability by reducing Cu of the metal thin film 3, and the emitter electrode 12a of the power semiconductor chip 12. However, hydrogen is not required to be added when there is no necessity for adding hydrogen, because each surface is clean. Here, explanation will be given for a hydrogen-added atmosphere, on the assumption that the surface of the metal thin film 3 is slightly oxidized.

When an entire body of the lead component 11 is heated, reduction by hydrogen is generated, and reduction of oxide on the Cu surface starts to occur from about 200° C. Further, by this heating, each metal of Cu, Al, and Zn starts to diffuse, on the interface thereof. Among these metals, Zn is an element easy to be diffused. Therefore, Zn is diffused extending to the Cu surface in a relatively short period of time, if the Zn surface is covered with a metal thin film of Cu. At this time, a slight amount of oxygen is mixed in the atmosphere in many cases, and there is a possibility that Zn is oxidized by such mixed oxygen. A Zn oxide film thus formed is hardly reduced even by hydrogen, and when an overall surface of the solder part is covered with the Zn oxide film, there is a possibility that the wettability is inhibited. Accordingly, Zn needs to be prevented from appearing on the surface. For this purpose, since diffusion between Zn and Al is slower than the diffusion between Cu and Zn, the Al layer 2 is arranged on the Zn layer 1, and the Al surface is covered with the metal thin film 3. An effect of suppressing the diffusion of Zn can be obtained even if a layer thickness of the Al layer 2 is about 1 μm, if the Al layer 2 is a uniform and dense film. However, a suppression effect is increased if the layer thickness is approximately 3 μm or more, and a stable suppression effect can be obtained if the layer thickness is about 7 μm. Although an influence of the diffusion of Cu/Al can also be considered, the diffusion between Cu/Al occurs relatively slowly, and there is almost no risk that Al is diffused and exposed to the Cu surface.

(An Example of a Suitable Structure of the Solder Part)

As an example of a suitable structure of the solder part 22 in FIG. 1, the Zn layer has a thickness of 45 μm, the Al layer has a thickness of 8 μm, and the Cu metal thin film has a thickness of 1 μm, at the inner A-side. With such thicknesses, eutectic composition of approximately Zn-6 mass % Al can be obtained, and a diffusion suppressive effect of Zn by Al can also be obtained, and further an oxidation preventive effect of Zn and Al by Cu can also be obtained. As described above, although slight oxidation is generated in Cu itself, the oxide can be reduced by adjusting the atmosphere during bonding and by heating the entire body of the lead component 11. Therefore, a bonding property is hardly inhibited.

In this state, when Zn and Al is heated at 382° C. or more, dissolution of Zn and Al occurs caused by eutectic dissolution of Zn and Al, thus also allowing the dissolution of Cu of the metal thin film 3 to occur into a Zn—Al solution, and this solution is wet and spread over the emitter electrode 12a of the power semiconductor chip 12, to thereby obtain the connection. Similarly, the connection to the lead frame (lead component 11) can be obtained at the outer B-side as well.

Modified examples (first to seventh modified examples) of the first embodiment will be described hereafter. Note that in these modified examples, the same signs and numerals are assigned to the same structures as those of the first embodiment, and explanation thereof is omitted.

First Modified Example

Figure 2:
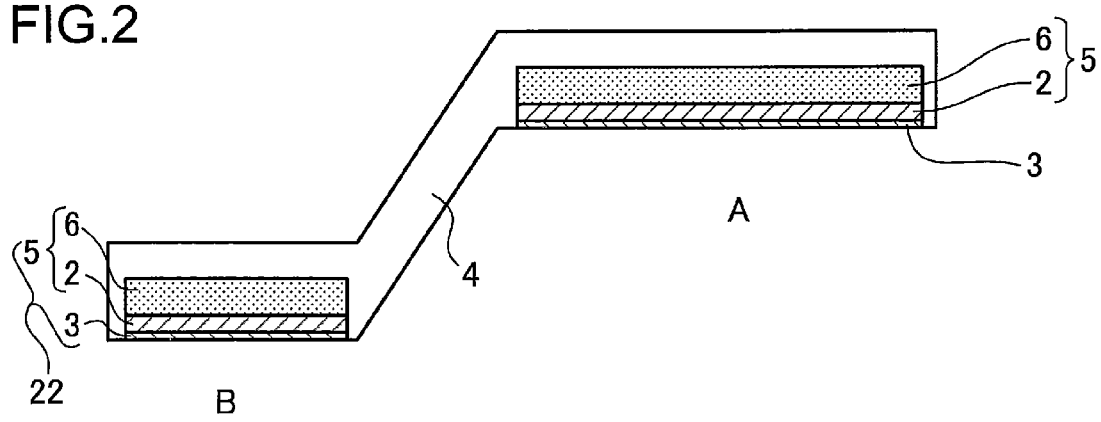
FIG. 2 is a cross-sectional view showing the emitter-side lead component according to a modified example (first modified example) of the first embodiment of the present invention.

FIG. 2 shows a first modified example of the first embodiment of the emitter-side lead component 11. A different point from the first embodiment is that a Zn layer 6 is formed by the Zn-bonding material composed of a Zn—Al based alloy, instead of the Zn layer 1, and the Zn layer 6 thus formed is clad onto the lead frame base material 4. The Al layer 2 and the metal thin film 3 are laminated and clad onto the surface of the lead frame base material 4, and this point is the same as the first embodiment. The average composition of the Zn layer 6 formed by the Zn-bonding material composed of the Zn—Al based alloy and the Al layer 2, may be designed to obtain Zn-6 mass % Al. Thus, similar connectability as the connectability of the first embodiment can be obtained.

Second Modified Example

Figure 3:
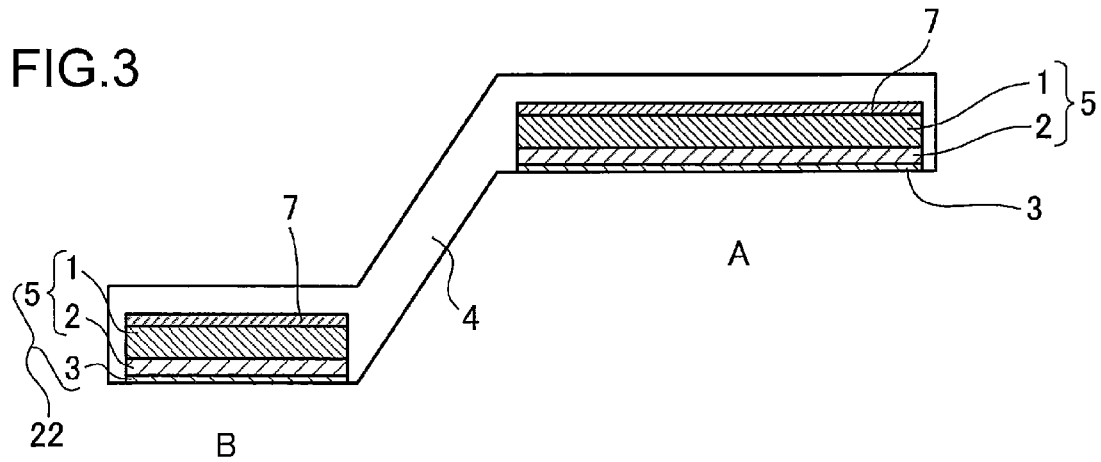
FIG. 3 is a cross-sectional view showing the emitter-side lead component according to a modified example (second modified example) of the first embodiment of the present invention.

FIG. 3 shows a second modified example of the first embodiment of the emitter-side lead component 11. A different point from the first embodiment is that a Ni layer 7 is arranged between the Zn layer 1 and the lead frame base material 4. As described above, each kind of metal can be used for the lead frame base material 4, and when Cu is used, the following case can be considered: Zn of the solder component and Cu of the lead frame base material 4 are reacted to thereby generate lots of inter-metal compounds. In such a case, as shown in FIG. 3, reaction between the solder material 5 and the lead frame base material 4 can be suppressed by arranging the Ni layer 7 as a ground layer. The ground layer is not limited to Ni, and generally Pt, Pd, and Ti, etc., which are slow in dissolving into solder and are used as barrier metals, can be used for the ground layer. Ni is taken as a typical example for explanation.

Third Modified Example

Figure 4:
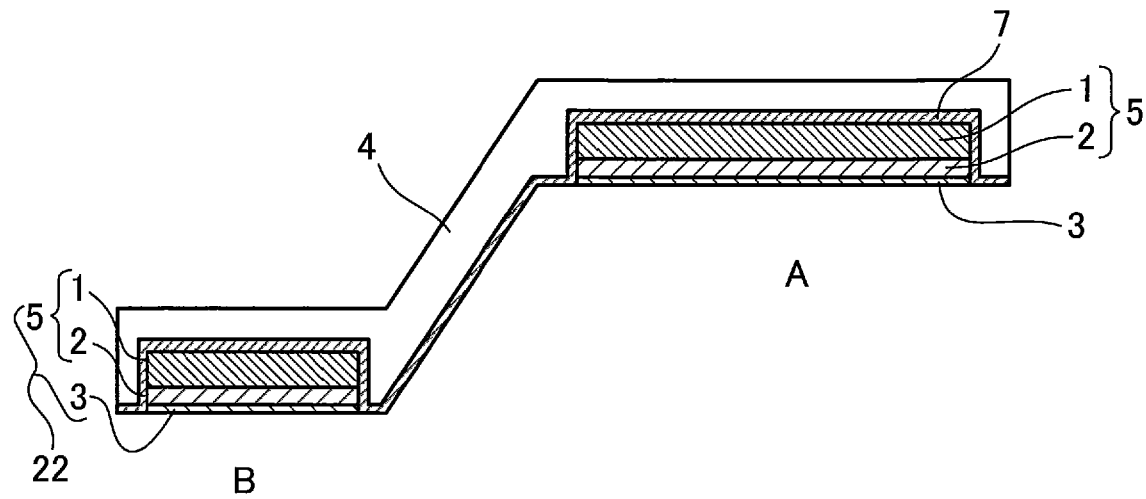
FIG. 4 is a cross-sectional view showing the emitter-side lead component according to a modified example (third modified example) of the first embodiment of the present invention.

FIG. 4 shows a third modified example of the first embodiment of the emitter-side lead component 11. A different point in addition to the second modified example, is that the Ni layer 7 is also formed on the surface of the lead frame base material 4 other than the solder part 22. Thus, the reaction between the component of the solder part 22 and the lead frame base material 4 can be surely suppressed.

The structure as shown in FIG. 4 is achieved by the following step. Ni plate is clad onto the lead frame base material 4 with the same width, or Ni plating is applied thereto. Ni is incorporated into the Ni layer 7. The Zn layer 1, the Al layer 2, and the metal thin film 3 are clad-rolled on the Ni layer 7.

Fourth to Seventh Modified Examples

FIG. 5 to FIG. 8 show fourth to seventh modified examples of the first embodiment of the emitter-side lead component 11. A different point in addition to the third modified example is that the connection part of the solder part 22 is processed into a projection shape to thereby enhance connectability. Specific explanation will be given hereafter.

Figure 5:
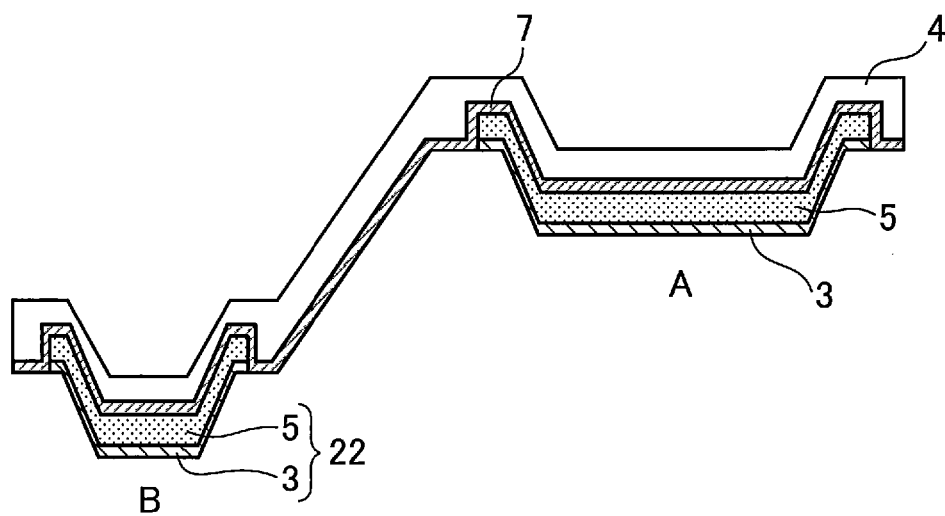
FIG. 5 is a cross-sectional view showing the emitter-side lead component according to a modified example (fourth modified example) of the first embodiment of the present invention.

According to the fourth modified example of FIG. 5, a rear surface of a prescribed region at the inner A-side and the outer B-side of the lead component 11 is pushed up to float the surface, thus forming the solder part 22 into the projection shape. The top portion of the projection shape is formed as a flat surface, and a flat top of the solder part 22 having a projected top portion is firmly pressed against the semiconductor chip. In order to process the lead component into such a structure, the bar is molded by applying press work thereto, to thereby manufacture the lead frame (lead component). In this case, a press die is designed to obtain a shape as shown in the figure, thus making it possible to easily mold the solder part 22 into the projection shape.

Figure 6:
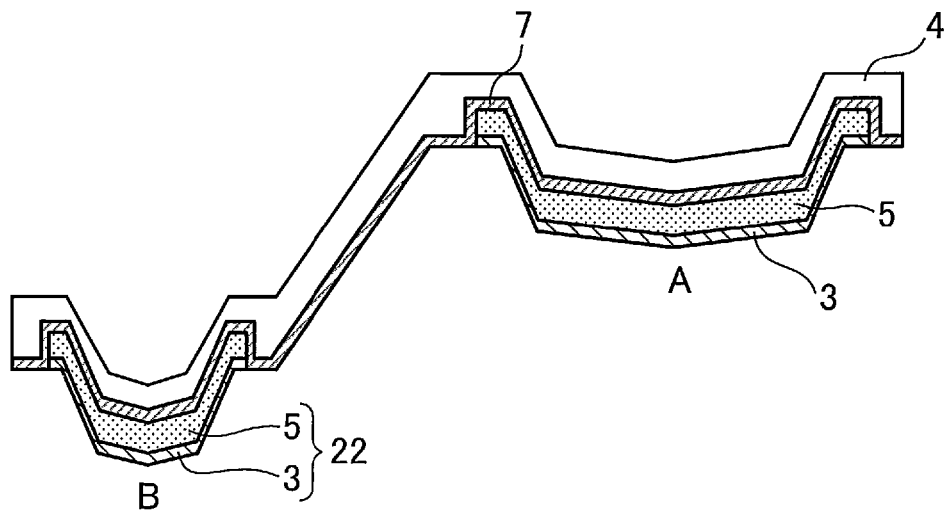
FIG. 6 is a cross-sectional view showing the emitter-side lead component according to a modified example (fifth modified example) of the first embodiment of the present invention.

According to the fifth modified example of FIG. 6, the solder part 22 having the projected top portion as shown in FIG. 5 is further configured to be formed into a mountain shape in such a manner that the flat top portion is projected in a direction of connecting to the semiconductor chip. The solder is wet and spread from the vicinity of a center of the mountain shape of the top portion of the projected solder part 22 which is pressed against the semiconductor chip. With this structure, roll-in of a void rarely occurs.

Figure 7:
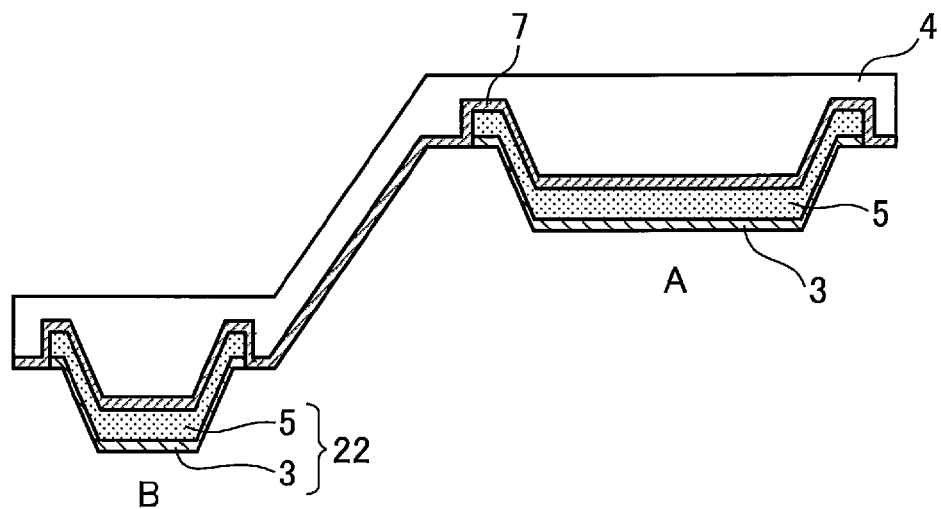
FIG. 7 is a cross-sectional view showing the emitter-side lead component according to a modified example (sixth modified example) of the first embodiment of the present invention.
Figure 8:
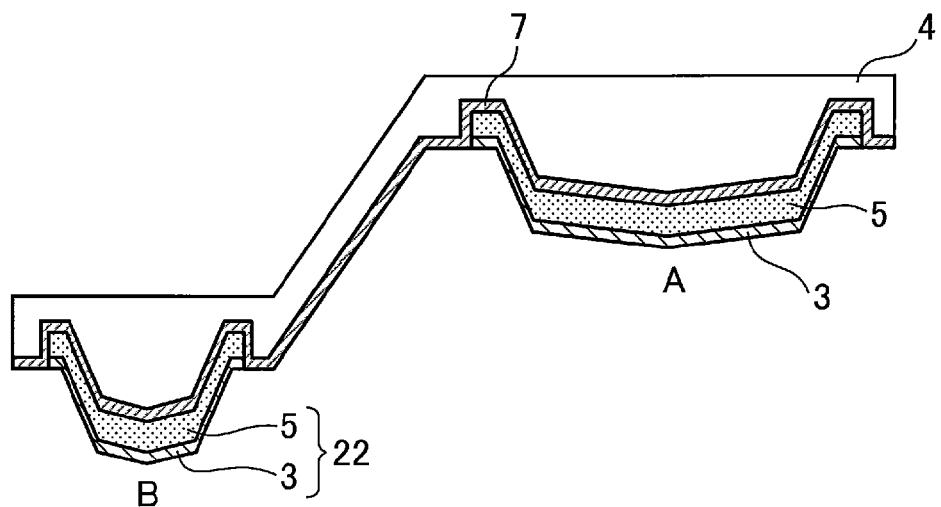
FIG. 8 is a cross-sectional view showing the emitter-side lead component according to a modified example (seventh modified example) of the first embodiment of the present invention.

According to the sixth modified example of FIG. 7 and the seventh modified example of FIG. 8, mainly an outer peripheral part of the solder part 22 is crushed to thereby form the projection shape, with the rear surface of the lead frame base material 4 on the opposite side to the solder part 22 stay as a flat part, corresponding to FIG. 5 and FIG. 6 respectively. Thus, by having a flat rear surface of the lead frame base material 4 on the opposite side to the solder part 22, the thickness of resin at resin molding time can be made thin compared with structures of FIG. 5 and FIG. 6, and therefore heat radiation property can be enhanced.

Second Embodiment (Collector-Side Lead Component)

The emitter-side lead component 11 for connecting the emitter electrode 12a of the power semiconductor chip 12, has been described heretofore. The collector-side lead component for connecting to a collector electrode of the power semiconductor chip, will be described next. Note that the same signs and numerals are assigned to the same structure as the structure of the first embodiment, and explanation thereof is omitted.

Figure 9A:
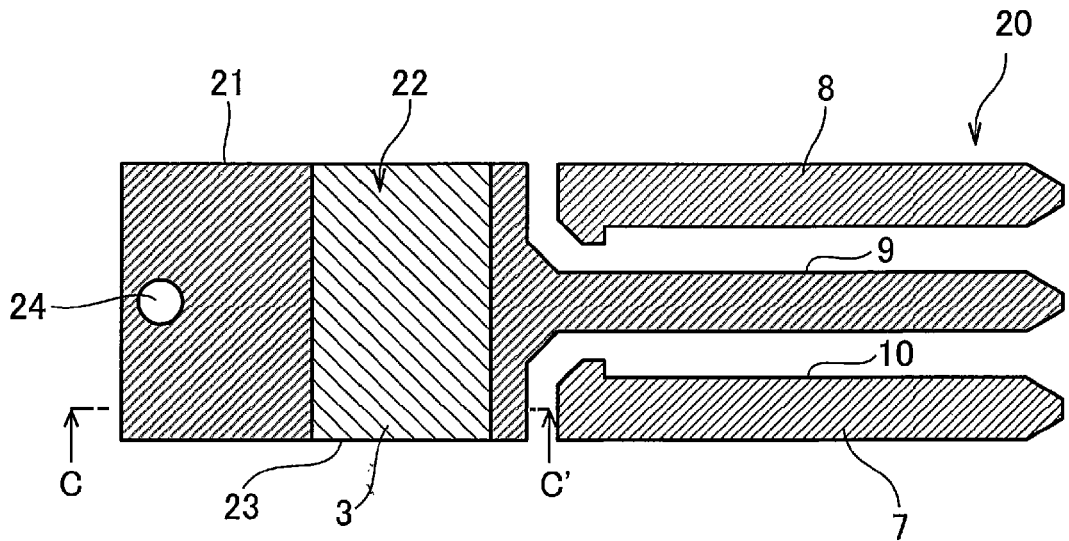
FIG. 9A is an upper side view showing a collector-side lead component according to a second embodiment of the present invention.

FIG. 9A shows a lead frame 20 having the collector-side lead component for connecting to the collector electrode in the insertion mounting type lead frame. The lead component is constituted of a header 21, a collector lead 9, a gate lead 8, and an emitter lead 10. The lead frame 20 is formed so that flow solder connection can be obtained by inserting each of the emitter lead 10, the collector lead 9, and the gate lead 8, into a hold of the printed wiring board (not shown). The lead frame 20 shows one power semiconductor chip.

As shown in FIG. 9A, the lead frame 20 is constituted of a header 21 and three leads 8, 9, 10. The collector lead 9 is formed integrally with the header 21. The gate lead 8 and the emitter lead 10 are provided so as to be separated from the collector lead 9 and in parallel to the collector lead 9, at both sides of the collector lead 9 positioned in the center. A mounting hole 24 and a semiconductor chip mounting part 23 are provided to the header 21. The solder part 22 is formed in the semiconductor chip mounting part 23. The collector electrode of the power semiconductor chip is connected to the solder part 22. The connection is made by die bonding.

Figure 9B:
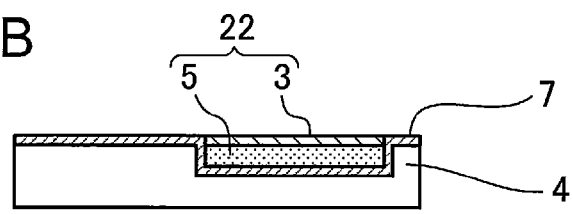
FIG. 9B to FIG. 9E are essential cross-sectional views showing the collector-side lead component according to a second embodiment of the present invention, respectively.

The structure of the solder part 22 and the projection structure are similar to the embodiment of the lead component 11 for connecting the emitter electrode as described above. Therefore, cross-sectional structures taken along the line C-C' in the header 21 are shown collectively in FIG. 9E from FIG. 9B. Regarding a flat structure of the solder part 22, one kind thereof is shown in FIG. 9B, and regarding the projection structure, three kinds thereof are shown in FIG. 9C to FIG. 9E.

The structure of the solder part 22 is commonly shown in FIG. 9B to FIG. 9E, wherein the metal thin film 3 is laminated on the solder material 5, and the Ni layer 7 is arranged between the solder material 5 and the lead frame base material 4. The Ni layer 7 is also formed on the surface of the lead frame base material 4 other than the solder part 22, and an entire surface (one surface) of the lead frame base material 4 is covered with the Ni layer 7.

The solder material 5 may be formed as either of a lamination of the Zn layer 1 and Al layer 2 shown in FIG. 1, or a lamination of the Zn layer 6 and the Al layer 2 composed of the Zn—Al based alloy shown in FIG. 2. An overall surface of the lead frame base material 4 is covered with the Ni layer 7. However, a structure without the Ni layer 7 is also acceptable, depending on the purpose of use.

Figure 9C:
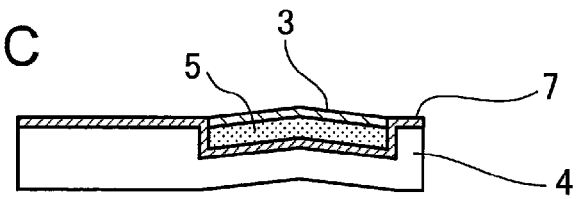
Figure 9D:
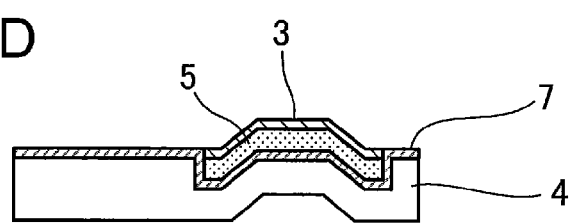
Figure 9E:
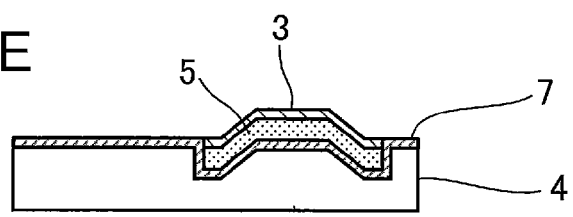

FIG. 9C shows a structure in which the top portion of the solder part 22 has a projection shape formed in a mountain shape so as to project in a direction of mounting the semiconductor chip, and the rear surface of the lead frame base material 4 has a recessed shape. FIG. 9D shows a structure in which the top portion of the solder part 22 has a flat trapezoidal projection shape, and the rear surface of the lead frame base material 4 has a trapezoidal recessed shape. FIG. 9E shows a structure in which the top portion of the solder part 22 has a flat trapezoidal projection shape, and the rear surface of the lead frame base material 4 is formed as a flat surface.

Figure 10:
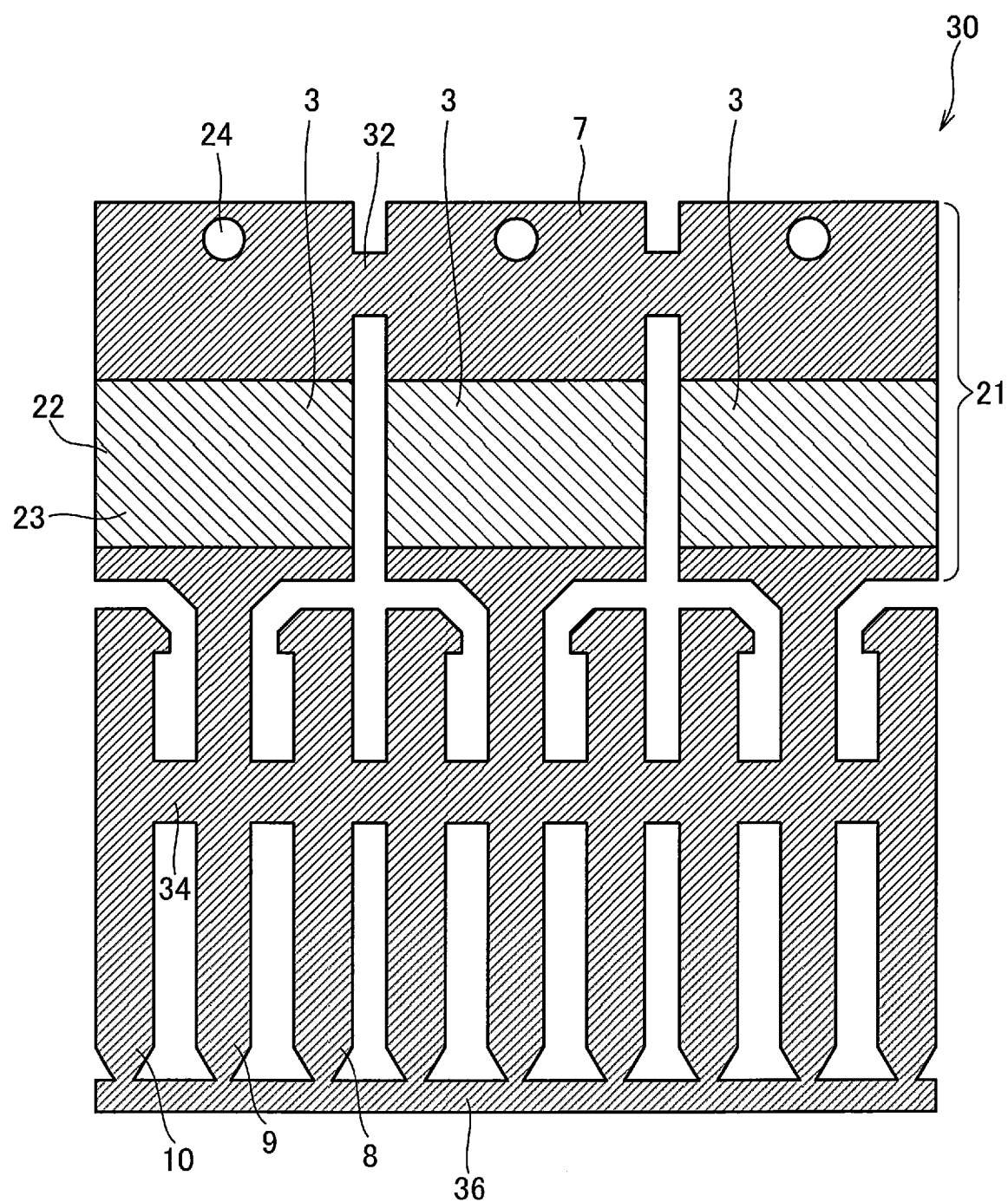
FIG. 10 is an upper side view showing a lead frame (lead component) of three semiconductor chips showing a part of manufacturing steps of FIG. 9B to FIG. 9E.

FIG. 10 shows a lead frame 30 having the collector-side lead components of any one of FIG. 9A to FIG. 9E. The lead frame which is a so-called TO-220, is imagined and drawn. Here, the lead frame of three power semiconductor chips is shown. Note that, actually a horizontally long lead frame having the number of lead components of much more power semiconductor elements is frequently used.

Each header 21 of the lead frame 30 is connected and supported by a supporting piece 32. Each lead 8, 9, 10 of the lead frame 30 is connected and supported by a tie-bar 34 and an outer frame 36. The clad-rolled solder part 22 is formed in the mounting part 23 of the semiconductor chips on the surface of the lead frame 30. Each power semiconductor chip is mounted on the solder part 22 by die bonding.

Third Embodiment

Figure 11:
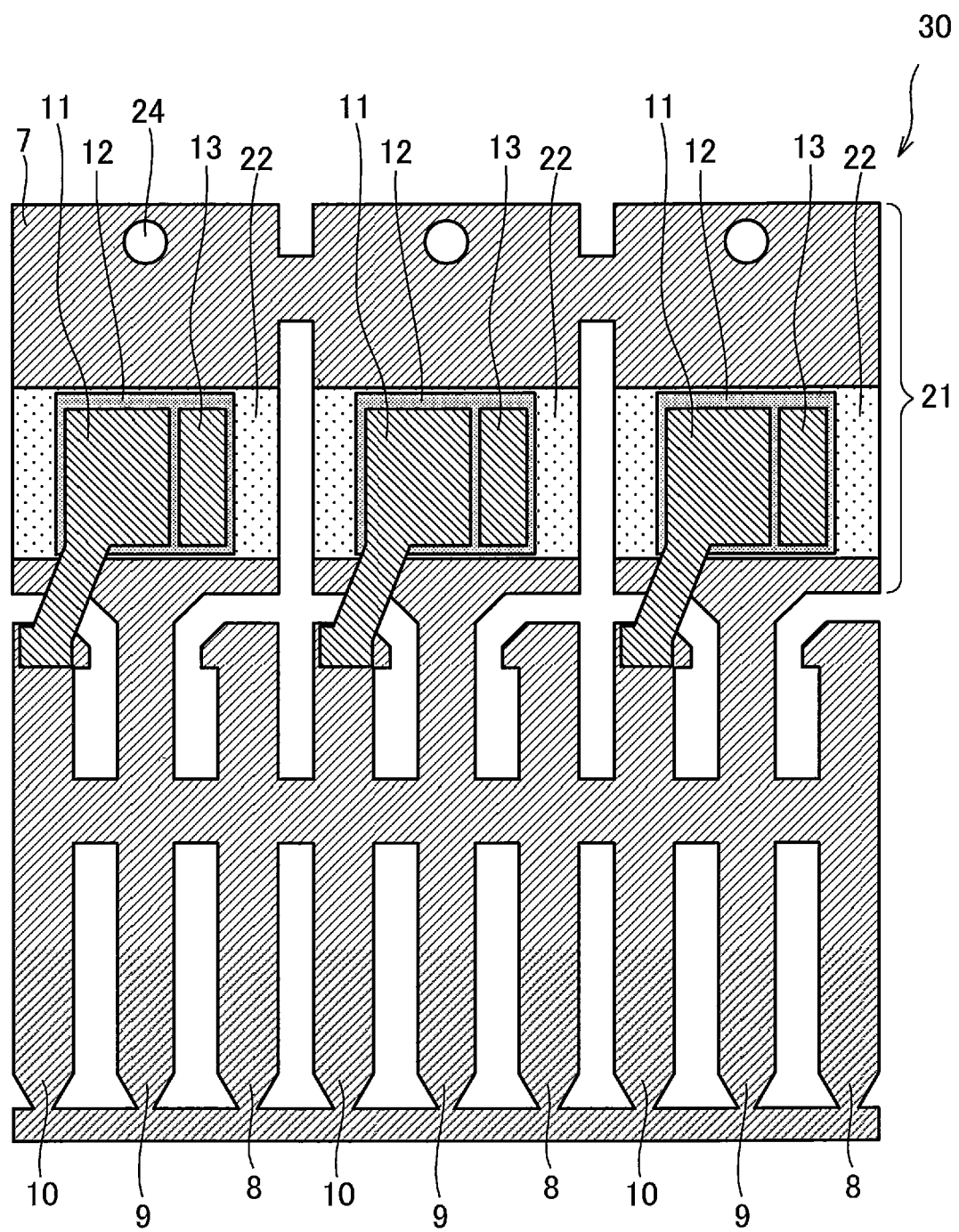
FIG. 11 is an upper side view of a lead frame having a semiconductor chip of the third embodiment of the present invention mounted thereon, and is a view showing a state that the semiconductor chip and the emitter-side lead component with a structure of any one of FIG. 1 to FIG. 8 are sequentially connected on the collector-side lead frame of FIG. 10.
Figure 12:
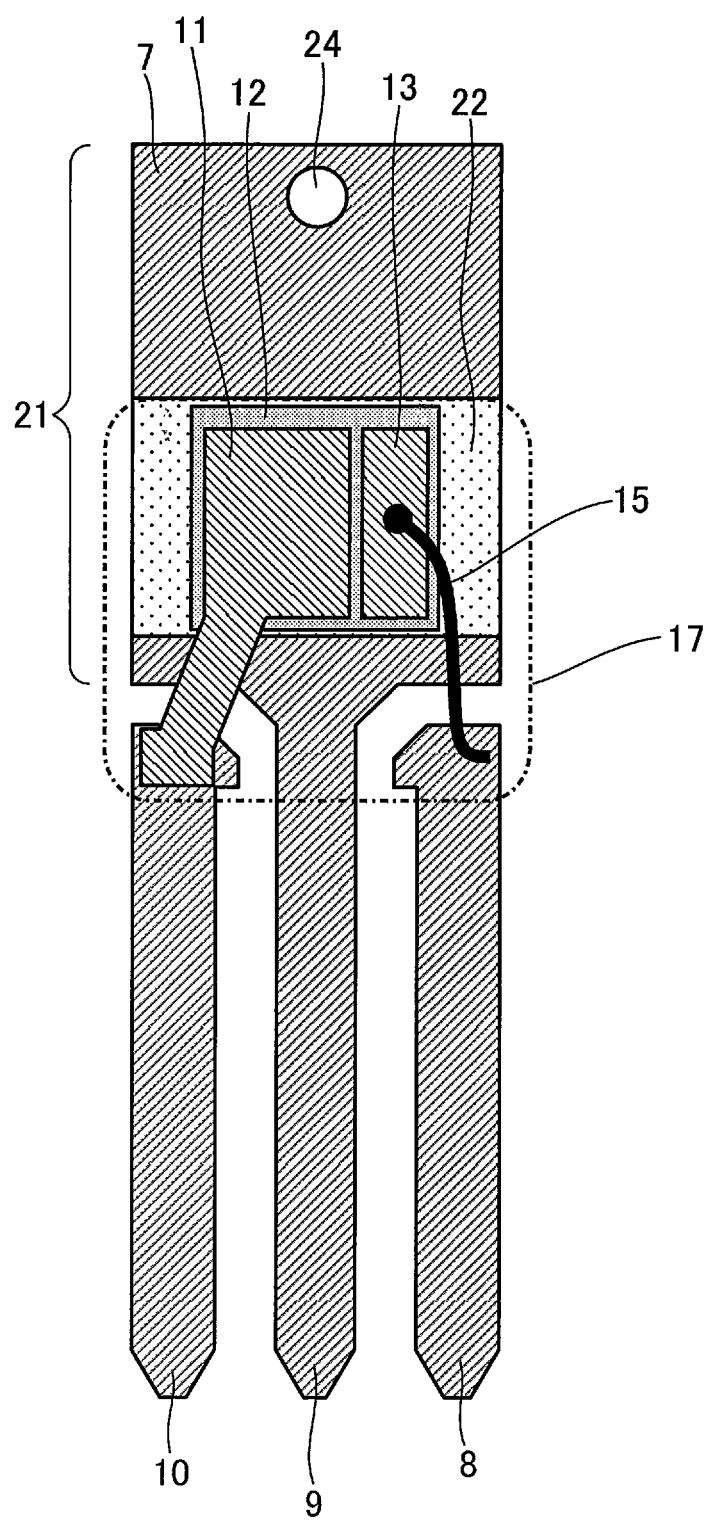
FIG. 12 is an upper side view showing a state that the lead frame of FIG. 11 is divided into one semiconductor chip, and further a gate electrode is wired to a gate lead.

FIG. 11 is an upper surface view showing a state that each power semiconductor chip 12 is mounted on the lead frame 30 having the lead components according to the second embodiment of the present invention. The power semiconductor chip 12 has the collector electrode (not shown) formed on a lower surface, and the emitter electrode (not shown) and the gate electrode 13 formed on an upper surface respectively. As shown in FIG. 11, the power semiconductor chip 12 is die-bonded onto each solder part 22 of the lead frame 30, and the collector electrode on the lower surface is connected to the collector lead 9. The inner A-side of the emitter-side lead component 11 as shown in FIG. 1 to FIG. 8 is connected to the emitter electrode provided on the upper surface of the power semiconductor chip 12. The outer B-side of the emitter-side lead component 11 is connected to the emitter lead 10. Thus, the emitter electrode is connected to the emitter lead 10.

As shown in FIG. 12, the lead frame 30 is thereafter divided into one power semiconductor chip, and the gate electrode 13 is connected to the gate lead 8 by bonding wire 15. With this structure, the power semiconductor chip 12 is mounted on the lead frame 30, and the periphery of the power semiconductor chip 12 is buried with mold resin 17, to thereby manufacture the semiconductor package capable of positively radiating heat by the lead frame 30 not only from the collector electrode side but also from the emitter electrode side.

B. Surface Mounting Type Embodiment

FIG. 13A to FIG. 13E, and FIG. 14A1 to FIG. 14E show fourth and fifth embodiments of the collector-side and emitter-side lead components in the surface mounting type lead frame respectively. According to the lead component of FIG. 12 as described above, the lead frame is formed so that each lead of emitter, collector, and gate is inserted into the hole of the printed wiring board, to thereby obtain flow soldering connection. Meanwhile, FIG. 13A to FIG. 13E and FIG. 14A1 to FIG. 14E show the lead component (lead frame) in which lead is formed for surface mounting the semiconductor chip on the printed wiring board. Further, FIG. 15A to FIG. 15C show the semiconductor package of the sixth embodiment in which the periphery of the semiconductor chip is resin-molded and packaged based on FIG. 13A to FIG. 13E, and FIG. 14A1 to FIG. 14E, thus forming a surface mounting package in which a Gulwing-shaped (L-shaped) lead is led out from two side faces of the semiconductor package, and explanation will be given therefore hereafter. Note that in the fourth to sixth embodiments, the same signs and numerals are assigned to the same structure as the structure of the first embodiment, and explanation thereof is omitted.

Fourth Embodiment (Collector-Side Lead Component)

Figure 13A:
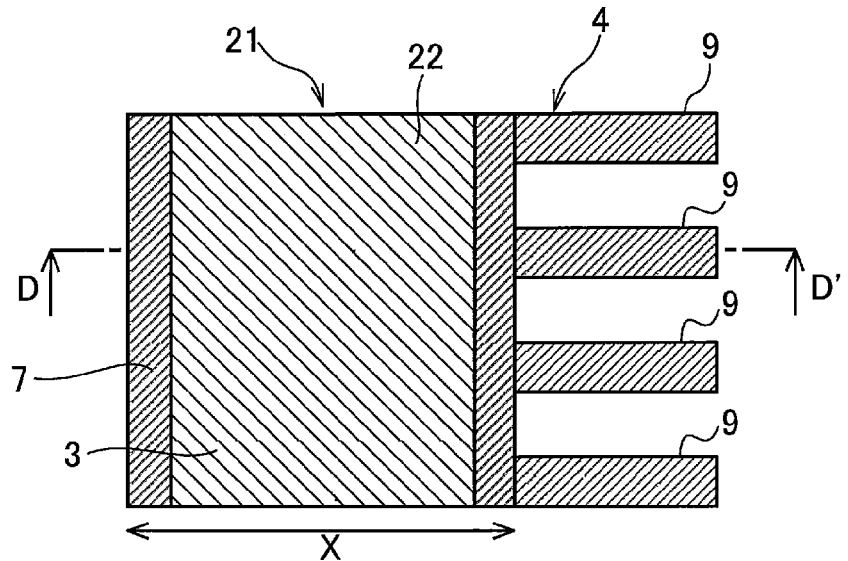
FIG. 13A is an upper side view showing the collector-side lead component according to a fourth embodiment of the present invention.
Figure 13B:
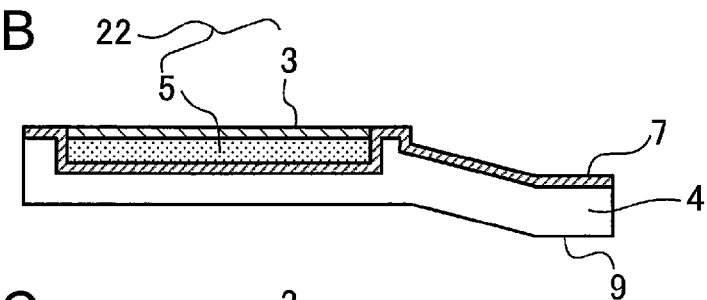
FIG. 13B to FIG. 13E are cross-sectional views showing the collector-side lead component according to the fourth embodiment of the present invention respectively.
Figure 13C:
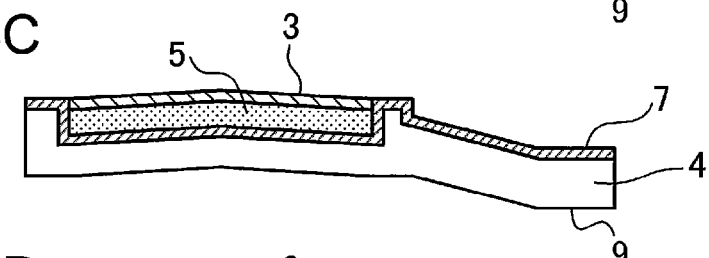
Figure 13D:
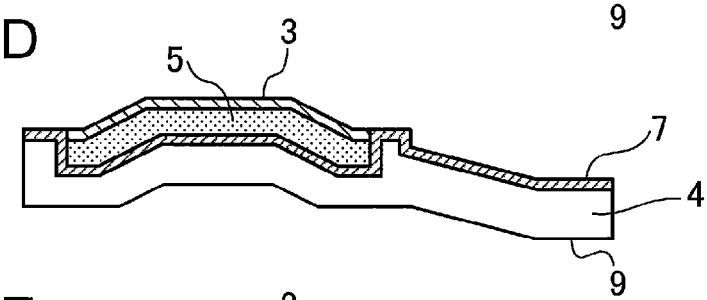
Figure 13E:
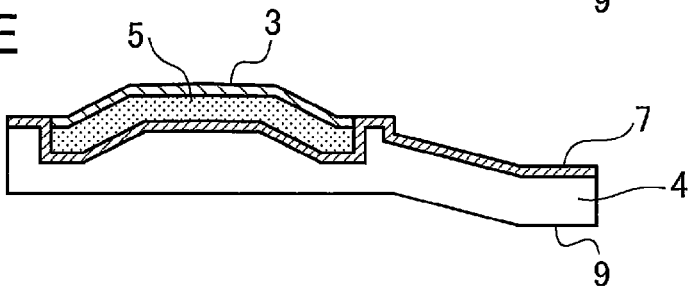

FIG. 13A shows the surface mounting type collector-side lead component. The collector-side lead component has the lead frame base material 4. The lead frame base material 4 has the header 21 and a plurality of collector leads 9 formed integrally with the header 21. The plurality of collector leads 9 are formed for obtaining a large electric current capacitance. The plurality of collector leads 9 are led out in the same direction at the same pin pitch from one side in a longitudinal direction of the header 21 having a length of X. Here, for example, explanation will be given for a case that the number of the collector lead 9 is four. Down-set work is applied to the collector lead 9, for pressing-down the collector lead 9 so that the surface mounting is achieved. The structure of the solder part 22 of the header 21 for mounting the semiconductor chip and the projection structure are similar to the insertion mounting type header as described above. Therefore, similarly to FIG. 9B and FIG. 9E, the cross-sectional structures taken along the line D-D' of FIG. 13A are collectively shown in FIG. 13B to FIG. 13E so as to correspond to those of FIG. 9B to FIG. 9E.

Fifth Embodiment (Emitter-Side Lead Component)

FIG. 14A1 and FIG. 14A2 show the surface mounting type emitter-side lead component. The emitter-side lead component is basically similar to the collector-side lead component shown in FIG. 13A. Similarly to FIG. 9B to FIG. 9E, the cross-sectional structures taken along the line E-E' of FIG. 14A1 to FIG. 14A2 are collectively shown in FIG. 14B to FIG. 14E so as to correspond to those of FIG. 9B to FIG. 9E. A plurality of emitter leads 10 are formed to thereby obtain a large electric current capacitance.

There are three different points between the emitter-side lead component and the collector-side lead component. A first different point is that the emitter lead 10 and the gate lead 8 are formed in the header 21 instead of the collector lead. A second different point is that down-set work is applied not to the lead but to the header 21. A third different point is that the gate lead 8 has a different structure from the structure of the emitter lead 10.

Two examples of the structure of the gate lead 8 are shown in FIG. 14A1 and FIG. 14A2. In the figures, G-region of the emitter-side lead component shows the connection part with the gate electrode, and F-region shows the connection part with the emitter electrode.

FIG. 14A1 shows a structure in which there is provided a solder part 22b which is clad onto the gate lead 8, similarly to a solder part 22a which is clad onto the emitter-side lead component. The gate electrode can be connected to the gate lead 8 only by connecting the gate electrode of the semiconductor chip to the clad solder part 22b.

FIG. 14A2 shows a structure without the solder part which is clad onto the gate lead 8. In this structure, a gate head 22C with a part thereof remained to be linked to the gate lead 8, and the gate electrode of the semiconductor chip are connected by bonding wire, and the gate electrode is connected to the gate lead 8.

Sixth Embodiment

FIG. 15A to FIG. 15C show a plurality of examples of semiconductor packages 40 in which the power semiconductor chip 12 is connected using the lead frames (lead components) of FIG. 13A to FIG. 13E and FIG. 14A to FIG. 14E, which are then packaged by mold resin 17. The lead which is formed by the Gulwing-shaped (L-shaped) lead frame base material 4 is led out from two side faces of the semiconductor package 40. A press-down distance of the down-set work is taken larger in the emitter lead 10 led out from one of the side faces of the semiconductor package 40, than in the collector lead 9 led out from the other side face of the semiconductor package 40, so that both leads (outer) are aligned with each other on the same mounting surface. Wherein, the semiconductor package 40 is mainly constituted of the power semiconductor chip 12, the lead frame (lead component), and the mold resin 17.

Regarding electrodes of the power semiconductor chip 12, the electrodes formed at an upper side of the power semiconductor chip 12 is the emitter electrode and the gate electrode, and the electrodes formed at a lower side thereof is the collector electrode (any one of the electrodes is not shown). The gate electrode may be connected by either of the solder connection or wire bonding, as described in FIG. 14A1 and FIG. 14A2. The emitter electrode and the collector electrode are connected by solder 16. The solder 16 is obtained in such a way that the solder part formed by cladding is dissolved, and wet and spread over the electrodes of the power semiconductor chip 12, and is thereafter solidified by cooling. Each semiconductor package will be described hereafter.

In the semiconductor package 40 shown in FIG. 15A, the Ni layer 7 of the emitter-side and the collector-side lead frame is formed up to the outside of the mold resin 17.

The semiconductor package shown in FIG. 15B has a structure without the Ni layer 7. In this case, it is suitable to use 42 alloy containing more Ni than Cu, for the lead frame base material 4, because the reaction between the solder 16 and the lead frame base material 4 can be suppressed.

In the semiconductor package shown in FIG. 15C, the solder part which is clad onto the lead frame base material 4 is connected to the power semiconductor chip using a melted solder 16 which exists only at the collector side. The Ni layer 7 of the collector-side lead frame base material 4 is formed only in the mold resin 17. At the emitter side, the power semiconductor chip 12 is connected to the Ni layer 7 of the lead frame base material 4 using a bump 18 provided to the power semiconductor chip 12. Accordingly, the solder material with clad materials laminated as shown in FIG. 14A1 to FIG. 14E is not used in the emitter-side lead frame. For example, a stud bump made of Au or Al wire bonding or a solder bump supplied separately, is suitably used as the bump 18.

Other Embodiment (Formation of the Connection Part by Etching Removal)

According to the aforementioned embodiment, the solder material is rolled and clad-bonded onto a part of the base material of the lead component, to thereby form the solder part in a prescribed region including the connection part, and the clad-bonded solder part is connected to the semiconductor chip to form the connection part. However, it is also possible to manufacture the lead component to form the connection part by rolling and clad-bonding the solder part on an entire surface of one side of the base material of the lead component, and removing the solder part by etching in a region excluding the aforementioned prescribed region on the base material of the lead component.

In this case as well, the solder material is brought into contact with one surface of the base material of the lead component under pressure and is bonded thereto, to thereby mount the semiconductor chip without cleaning at the assembly side, and in addition, labor of positioning the solder material can be saved, oxidation of the solder can be prevented, and a cost can be reduced. Further, the solder part is etched so as to leave a semiconductor chip connection scheduled region of the solder material, which is brought into contact with the base material under pressure and bonded thereto, and the solder part is formed in the semiconductor chip connection scheduled region, to thereby easily form the solder part, compared with a reflow which requires positioning of the solder material. Accordingly, the solder part can be easily connected to the semiconductor chip, and the lead component having excellent connectability can be easily manufactured.

(Application to a Modular Power Semiconductor Product)

Further, the aforementioned embodiment relates to mainly an individually resin-molded power semiconductor package. The lead component according to the aforementioned embodiment can also be applied to a so-called modular power semiconductor product. For example, an inverter module treating a high power, has a structure that the power semiconductor chip is connected to a substrate with Cu pasted on ceramic, and a ceramic substrate is fixed to another frame, and an entire body is sealed by a gelatinous resin. In such a module, for example it is difficult to apply the clad-rolled solder material as described above, to the collector-side Cu electrode. This is because generally Cu and ceramic are bonded to each other by brazing with a brazing material having a high melting point, and therefore even if the solder material is formed on Cu by cladding, the solder material is melted upon brazing.

However, regarding the emitter-side, the lead frame as shown in FIG. 1 to FIG. 8 can be used. There is a merit of improving reliability in using such a lead frame. Conventionally, wire bonding is used for connecting the emitter electrode. However, the inverter module with large heat generation, has a problem that a binding part is gradually run-down under an influence of elongation and contraction of a wire due to repeated temperature variation, finally allowing a disconnection to occur caused by a large current. Such a problem can be solved by using the lead frame shown in FIG. 1 to FIG. 8.

Further, in the aforementioned embodiment, the solder part is formed by the inlaid-clad material embedded into the base material. However, the embodiment is not limited thereto, and a Toplay clad material is also acceptable, which is obtained by bringing the solder part into contact with a part of one surface or both surfaces of the metal substrate under pressure, and bonded thereto in a projection shape.

Effect of the Embodiments

According to these embodiments, one or more effects can be exhibited as described below.

(1) According to these embodiments, the solder material is clad-bonded to a prescribed region including the connection part on the base material. Therefore, use of the lead component of this embodiment makes it possible to provide an inexpensive lead component which can be easily connected to the semiconductor chip and which has excellent connectability, compared with a case that the solder material is individually supplied to a prescribed position on the base material.

Further, by rolling the solder material over the connection part on the base material, the solder material is rolled and an interface is newly formed to thereby obtain satisfactory clad bonding. Further, by covering the surface of the Al layer with the metal thin film, oxidation of the solder material can be suppressed. Further, Zn and Al turn into a liquid due to eutectic dissolution, thus also dissolving the metal thin film into this liquid, which is then wet and spread over the semiconductor chip. Therefore, the semiconductor chip and the lead component can be easily connected to each other. Accordingly, the connectability between the semiconductor chip and the lead component can be enhanced.

Further, it is the solder material bonded to the base material of the lead component, that is covered with the metal thin film. Therefore, the inexpensive lead component can be obtained, compared with a case that plating of Au-layer or Ag-layer is applied to a solder foil which is longer than the lead component. In addition, the Zn—Al based solder material can be used for die bonding the power semiconductor chip in which a high lead solder is used conventionally. Therefore, lead-free solder can be realized.

(2) As described in these embodiments, the base material side of the solder material is not formed by the Zn layer composed of Zn but is formed by the Zn layer composed of the Zn—Al base alloy. Thus, similarly to a case that the base material side of the solder material is formed by the Zn layer composed of Zn, the semiconductor chip and the lead component can be easily connected to each other, and the lead component having satisfactory connectability can be provided.

(3) As is described in these embodiments, by forming the metal layer composed of any one of Ti, Pt, Pd, and Ni, or forming the alloy layer including any one of them, between the solder material and the base material of the lead component, generation of lots of inter-metal compounds can be suppressed by suppressing a reaction between the solder material and the lead component. Accordingly, the lead component can be easily connected to the semiconductor chip, and the lead component with satisfactory connectability can be provided.

(4) As is described in these embodiments, by forming the solder material in a projection shape on the connection surface of the semiconductor chip, the lead component can be easily connected to the semiconductor chip, and the lead component with satisfactory connectability can be provided.

(5) As is described in these embodiments, by connecting the aforementioned any one of the lead components to the semiconductor chip, an inexpensive semiconductor package can be provided.

(6) When the semiconductor chip is the power semiconductor chip, by connecting at least any one of the emitter electrode, the gate electrode, and the collector electrode thereof, to the prescribed region of the lead component, an inexpensive power semiconductor package can be provided. In this case, by connecting the lead component not only to the collector-side electrode but also to the emitter-side electrode of the power semiconductor chip, positive heat radiation is enabled from the emitter side electrode of the power semiconductor chip, and a chip size can be made small. As a result, the number of effective chips from a wafer is increased, thus further contributing to a lower cost of the power semiconductor.

(7) As is described in these embodiments, by forming the solder part by rolling and embedding the solder material in a scheduled region where the semiconductor chip of the base material of the lead component is connected, the labor of positioning the solder material can be saved, compared with the reflow which requires the positioning of the solder material, thus facilitating formation of the solder part. Accordingly, the lead component can be easily connected to the semiconductor chip, and the lead component with satisfactory connectability can be manufactured.

Example

An example of the present invention will be described. A process is basically the same, irrespective of either the lead framed for flow, or the lead frame for reflow. In this example, any one of Cu plated with Ni, 42 alloy containing lots of Ni, or an invar alloy, is used as the lead frame base material.

The Zn layer, the Al layer, and Cu layer of the metal thin film are supplied onto the lead frame base material by clad-rolling. Therefore, a thickness of an initial raw material is determined in consideration of a reduction ratio by clad-rolling. Explanation will be given hereafter, on the assumption that the reduction ratio is set to 80%, to thereby determine the thickness of the initial raw material as ⅕ thickness.

When Ni-plated Cu is used as the lead frame base material, Cu layer thickness is preferably set to about 5 mm, and Ni-layer plating thickness is preferably set to be relatively larger, and is suitably set to about 5 µm to 10 µm. When the invar alloy or the 42 alloy is used for the lead frame base material, Ni-plating can be eliminated, and the thickness of the base material is preferably set to about 5 mm. As the solder material raw materials such as Zn raw material:0.23 mm, Al-mateiral:40 µm, and Cu raw material:5 µm are used. By adjusting these materials so as to be positioned at a prescribed position on the lead frame base material, and clad-rolling is executed with a reduction ratio of 80%. Thus, an overall thickness is ⅕, and the thickness of the lead frame excluding the solder part is about 1 mm. When Cu is used for the lead frame base material, the Ni-plating layer has a thickness of about 1 µm to 2 µm after clad-rolling.

In the step of performing clad-bonding, by applying cleaning process to the surface of the material beforehand, adhesion on the interface can be enhanced. There is a risk that a material is cut in a case of an extremely thin material during the process. For example, a Cu raw material with a thickness of 5 µm has such a risk. In this case, the material made of Cu:50 µm, Al:400 µm are prepared in advance, and by clad-rolling this material with a reduction ratio of 90%, namely down to a thickness of ⅒, Cu/Al clad foil with a thickness of 45 μm is fabricated, which is then clad-rolled onto the raw material for the lead frame base material using Zn. Thus, the problem can be solved. The solder part after clad-rolling contains Zn:45 μm, Al:8 μm, and Cu:1 μm, to thereby obtain a structure of substantially Zn-6Al-3Cu composition. (0097)

Bonding of the semiconductor chip is executed by heating it in a nitrogen atmosphere containing about 4% of hydrogen. The Cu layer on the solder surface is reduced before the temperature reaches 382° C., to thereby form a state in which almost no oxide film exist. Thereafter, when the temperature reaches 382° C., the eutectic dissolution reaction occurs from the interface of Zn/Al, and a thin film made of Cu on the surface is dissolved into the liquid of the solder, and the solder liquid is wet and spread over the electrode of the semiconductor chip, to thereby obtain a connection. The solder is dissolved by being heated again at 382° C. or more. However, the solder does not dissolve at a temperature lower than 382° C., and therefore high thermostability can be obtained, compared with a conventional high-lead solder (having a melting point of about 300° C.), or the like.

The aforementioned example is an optimal example of the present invention, and the reason thereof will be described hereafter.

Cu plated with Ni or the invar alloy containing lots of Ni, or the 42 alloy is used for the lead frame base material. Cu has excellent thermal conductivity or electric conductivity, and therefore is used for a package in which heat radiation is emphasized. The invar alloy and the 42 alloy have a small thermal expansion coefficient, and have a thermal expansion coefficient close to that of the semiconductor chip, and therefore a residual stress after bonding becomes small. Accordingly, the invar alloy and the 42 alloy are suitable for a usage for a large sized chip.

When Cu is used for the lead frame base material, the surface is plated with Ni. This is because lots of vulnerable Cu—Zn compounds are formed by reaction between Zn—Al solder and Cu, thus generating a risk of damaging the Cu—Zn compound. Note that a generation amount of this compound is strongly influenced by temperature and time at the time of using the semiconductor upon bonding and after bonding. Accordingly, growth of the compound is not necessarily a problem. When the Ni-layer is formed, Ni causes reaction with mainly Al in the solder, to thereby form the Ni—Al compound. However, the growth of this compound is slow, and therefore deterioration of the interface is hardly caused. The same thing can be said when the 42 alloy or the invar is used.

When Cu is used for the lead frame base material, Ni is supplied thereto by plating, because this is easier in treating than a case that Ni is supplied to Cu by cladding for example. For example, in order to fabricate the Cu raw material with a thickness of 5 mm by cladding, wherein the Ni-layer with a thickness of 10 μm is formed on the surface, an original raw material contains Ni:50 μm, and Cu:25 mm, when a reduction ratio of 80% is taken into consideration. There is no problem if there is a facility capable of cladding such a material. However, a range of the thickness of the material is limited to a certain degree, depending on the facility, and therefore in this example, explanation is given for a case that the Ni-layer is formed by plating.

The solder is formed with a thickness of each layer set so that Zn-layer is 45 μm, the Al-layer is 8 μm, the Cu-layer is 1 μm, and so as to have a structure of substantially Zn-6Al-3Cu composition. This is because the solder having a thickness of such a degree is frequently used for die bonding the current power semiconductor chip. Also, this is because a target of the composition is in the vicinity of the Zn—Al eutectic as described above, and therefore excellent solubility can be obtained. Cu exists for suppressing oxidation of the surface, and diffusion is suppressed by Al, and therefore there is no necessity for setting the thickness of the solder to be extremely large, and the thickness of about 1 μm is sufficient.

Not all of the aforementioned embodiments, modified examples, and combination of characteristics described and shown in the figures are necessarily required for the means for solving the problem of the present invention, and it is a matter of course, that various modified embodiments not departing from a range of a technical concept of the present invention are also acceptable.

What is claimed is:

1. A lead component including a base material having a connection part for connecting to a semiconductor chip, comprising:
    a solder part having a Zn layer made of a Zn-bonding material provided on the base material, and an Al layer made of an Al-bonding material provided on the Zn layer, in a prescribed region including the connection part on the base material, wherein a thickness of the Al layer is 1 μn or more, and an Al concentration in an average composition of the Za-layer and the Al-layer is 16.9% or less; and
    the solder part further comprising a metal thin film composed of one kind or two kinds or more of Au, Ag, Cu, Ni, Pd, and Pt covering a surface of the Al layer.

2. The lead component according to claim 1, wherein the Zn layer is composed of a Zn-Al based bonding material.

3. The lead component according to claim 1, wherein a metal layer composed of one kind of Ti, Pt, Pd, and Ni, or an alloy layer containing any one of them, is formed between the base material and the solder part.

4. The lead component according to claim 1, wherein the connection part is formed in a projection shape on a connection surface side connected to the semiconductor chip.

5. A semiconductor package comprising the lead component according to claim 1, and a semiconductor chip connected to a prescribed region including the connection part of the lead component.

6. The semiconductor package according to claim 5, wherein the semiconductor chip is a power semiconductor chip having an emitter electrode and a gate electrode on a surface, and a collector electrode on a rear surface, and
    at least one of the emitter electrode, the gate electrode, and the collector electrode is connected to the prescribed region of the lead component.

7. A method for manufacturing a lead component including a base material having a connection part for connecting to a semiconductor chip, comprising:
    forming a solder part by sequentially laminating a Zn layer on the base material, an Al layer on the Zn layer, and a metal thin film composed of one kind or two kinds or more of Au, Ag, Cu, Ni, Pd, and Pt on the Al layer, in a prescribed region including the connection part on the base material; and
    rolling and clad-bonding the solder part together with the base material, so that a thickness of the Al layer is 1 μm or more, and Al concentration in an average composition of the Zn layer and the Al layer is 16.9% or less.

8. A method for manufacturing the lead component according to claim 7, further comprising:
    removing a solder part by etching, in a region excluding a prescribed region on the base material out of the clad-bonded solder part; and
    forming the connection part connected to the semiconductor chip.

9. A method for manufacturing a lead component including a base material having a connection part for connecting to a semiconductor chip, comprising:
- forming a solder part by sequentially laminating a Zn layer on the base material, an Al layer on the Zn layer, and a metal thin film composed of one kind or two kinds or more of Au, Ag, Cu, Ni, Pd, and Pt on the Al layer, in a prescribed region including the connection part on the base material;
- rolling and clad-bonding the solder part together with the base material;
- removing a solder part by etching, in a region excluding a prescribed region on the base material out of the clad-bonded solder part; and
- forming the connection part connected to the semiconductor chip.

10. The lead component according to claim 1, wherein the thickness of the Al layer is 8 μm or less.

* * * * *